United States Patent
Cruz-Uribe et al.

(10) Patent No.: US 8,668,311 B2
(45) Date of Patent: Mar. 11, 2014

(54) PIEZOELECTRIC ACTUATOR HAVING EMBEDDED ELECTRODES

(75) Inventors: Tony S. Cruz-Uribe, Corvallis, OR (US); Peter Mardilovich, Corvallis, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 71 days.

(21) Appl. No.: 13/384,101

(22) PCT Filed: Oct. 30, 2009

(86) PCT No.: PCT/US2009/062866
§ 371 (c)(1),
(2), (4) Date: Jan. 13, 2012

(87) PCT Pub. No.: WO2011/053320
PCT Pub. Date: May 5, 2011

(65) Prior Publication Data
US 2012/0120160 A1 May 17, 2012

(51) Int. Cl.
*B41J 2/045* (2006.01)
*H01L 41/22* (2013.01)
*H01L 41/047* (2006.01)

(52) U.S. Cl.
USPC .............................. 347/68; 310/365; 310/330

(58) Field of Classification Search
USPC .................. 347/68; 310/330, 365; 216/18
See application file for complete search history.

(56) References Cited

U.S. PATENT DOCUMENTS

| | | | |
|---|---|---|---|
| 5,202,703 A | 4/1993 | Hoisington et al. | |
| 5,245,734 A | 9/1993 | Issartel | |
| 5,255,016 A | 10/1993 | Usui et al. | |
| 5,265,315 A | 11/1993 | Hoisington et al. | |
| 5,446,484 A | 8/1995 | Hoisington et al. | |
| 5,500,988 A | 3/1996 | Moynihan et al. | |
| 6,685,306 B2 | 2/2004 | Sugahara | |
| 7,378,782 B2 | 5/2008 | McKinstry et al. | |
| 7,518,287 B2* | 4/2009 | Hirasawa et al. | 310/323.02 |
| 7,524,041 B2 | 4/2009 | Sugahara | |
| 2002/0196314 A1* | 12/2002 | Greiser et al. | 347/68 |

FOREIGN PATENT DOCUMENTS

| | | |
|---|---|---|
| JP | 10144974 | 5/1998 |
| WO | WO-2007024038 | 3/2007 |

* cited by examiner

*Primary Examiner* — Lisa M Solomon

(57) ABSTRACT

A piezoelectric actuator includes a thin film sheet, a first electrode, and a second electrode. The thin film sheet is to physically deform in response to an electric field induced within the thin film sheet. The first electrode is embedded within the thin film sheet. The second electrode is embedded within the thin film sheet, and is interdigitated in relation to the first electrode. The electric field is induced within the thin film sheet via application of a voltage across the first and the second electrodes.

13 Claims, 7 Drawing Sheets

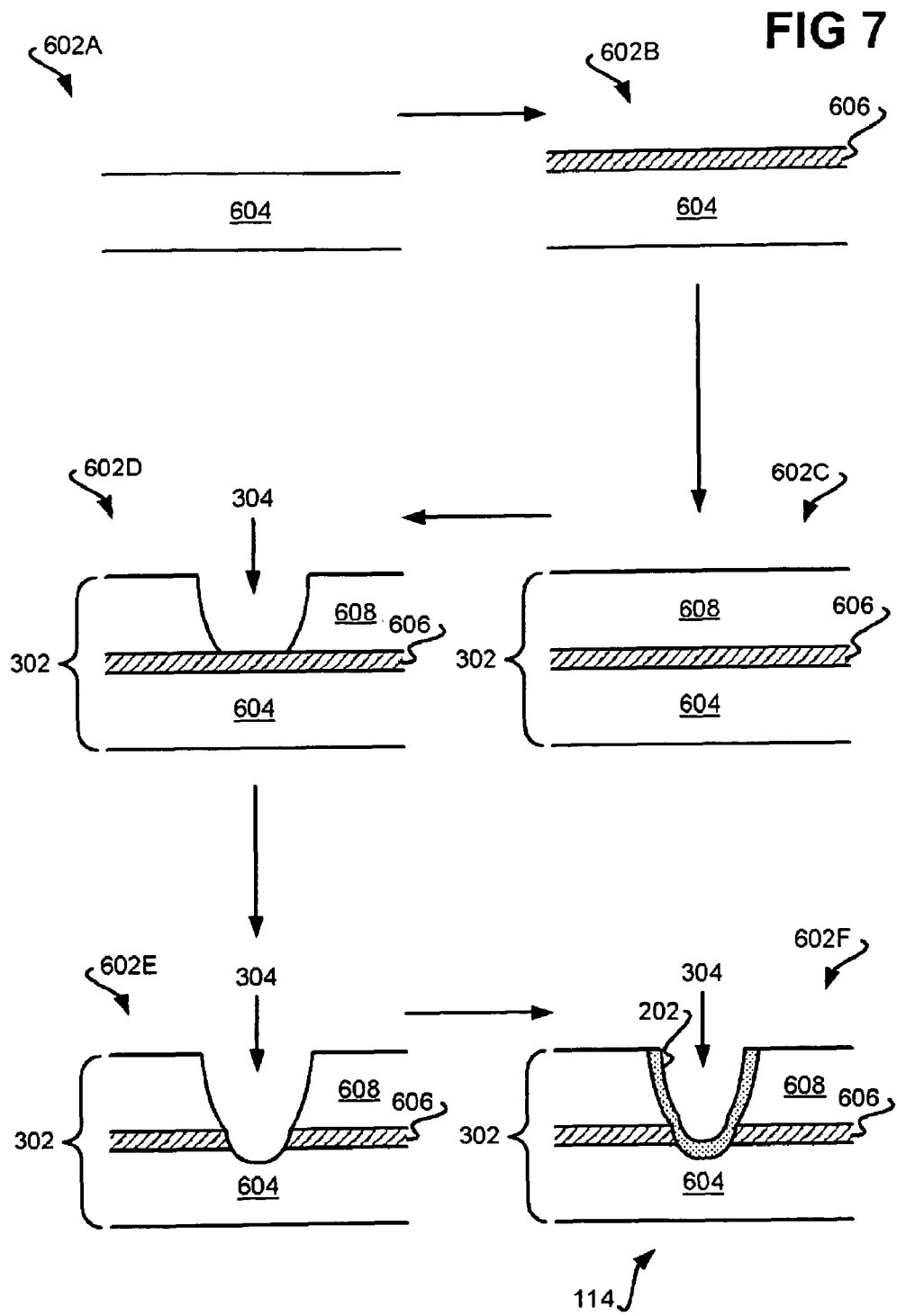

PIEZOELECTRIC ACTUATOR HAVING EMBEDDED ELECTRODES

BACKGROUND

Fluid-ejection devices are employed to eject droplets of fluid. For example, inkjet printing devices eject droplets of ink onto media like paper to form images on the media. One type of fluid-ejection device is a piezoelectric fluid-ejection device. In a piezoelectric fluid-ejection device, piezoelectricity is used to eject droplets of fluid. In particular, an electric field is induced within a flexible sheet of piezoelectric material to cause the sheet to physically deform. Physical deformation of the sheet results in one or more droplets of fluid being ejected.

BRIEF DESCRIPTION OF THE DRAWINGS

FIG. 7 is a diagram illustratively depicting a method for fabricating an actuator of a piezoelectric fluid-ejection assembly, according to an embodiment of the present disclosure.

DETAILED DESCRIPTION OF THE DRAWINGS

Figure 1:
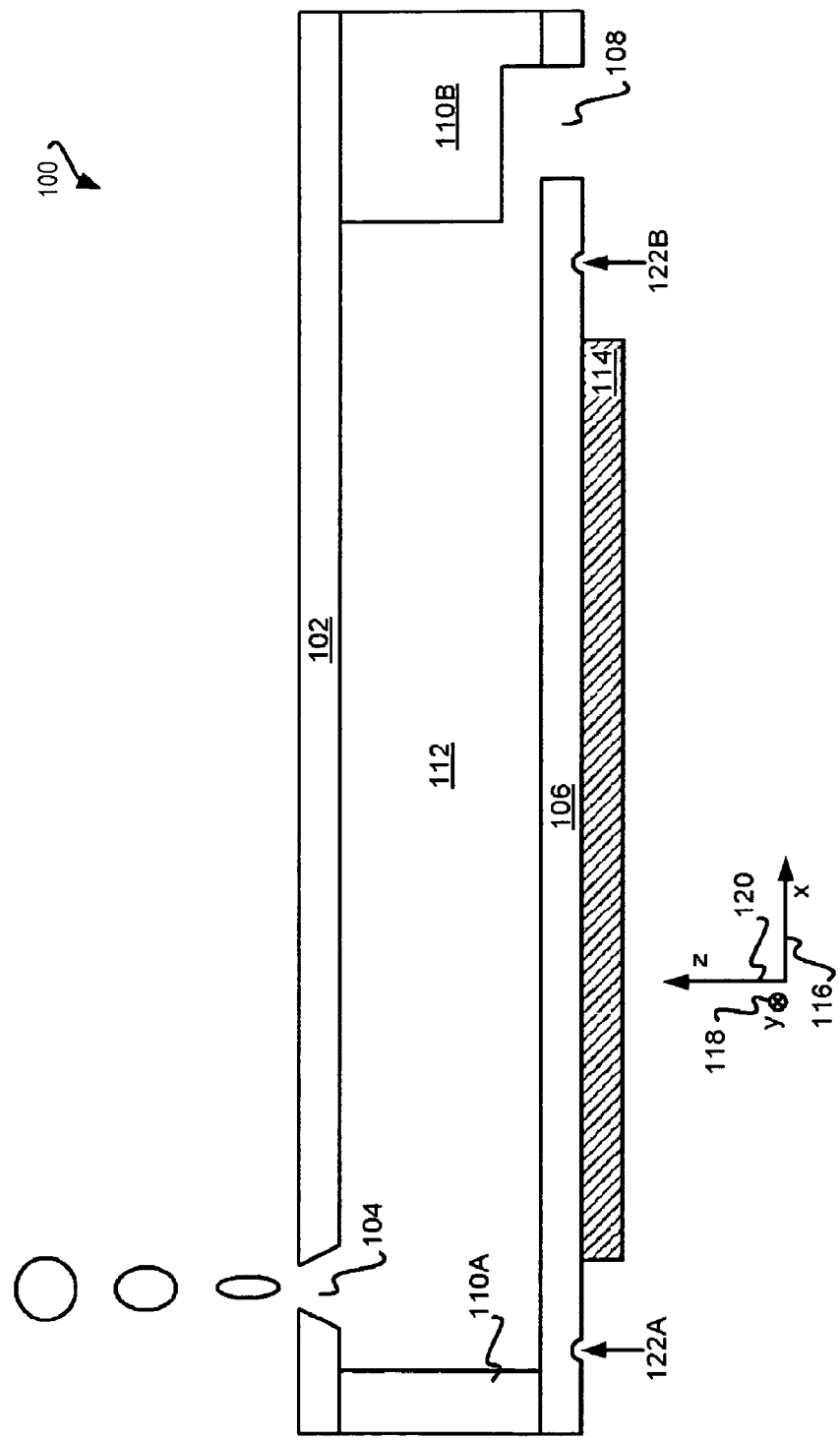
FIG. 1 is a diagram of a cross-sectional side view of a piezoelectric fluid-ejection assembly, according to an embodiment of the present disclosure.

As noted in the background, in a piezoelectric fluid-ejection device, an electric field is induced within a flexible sheet of piezoelectric material to cause the sheet to physically deform. The transfer of this mechanical response of the sheet to pressurizing fluid results in one or more droplets of fluid being ejected. The electric field is induced within the sheet by applying a voltage across electrodes disposed on the flexible sheet.

Conventionally, the electrodes are arranged in an opposing manner on the sheet. A first electrode is connected to a top surface of the sheet, and a bottom electrode is connected to a bottom surface of the sheet. This arrangement of the electrodes provides for a relatively large mechanical response from the sheet for a given voltage applied between the electrodes. However, fabricating a fluid-ejection device having the electrodes arranged in such an opposing manner on the sheet means that reliable electrical connection to the electrodes have to be made, which is relatively difficult to achieve, resulting in higher fabrication costs.

Therefore, one lower cost approach to arranging the electrodes on the sheet that has been tried is to position both electrodes onto the same surface of the sheet, such as in an interdigitated manner to result in what are referred to as interdigitated electrodes. Making electrical connections to both electrodes in a fluid-ejection device having the electrodes arranged on the same surface of the sheet is more easily achieved, and thus results in lower fabrication costs. However, such an arrangement of the electrodes provides for a smaller mechanical response to be induced within the sheet for a given voltage applied between the electrodes. Another advantage of interdigitated electrodes occurs when the piezoelectric material is a piezoceramic thin film. In this case, the absence of an electrode on one surface of the piezoceramic film permits a wider range of seed materials to be used that align the crystalline structure during growth of the thin film. Nevertheless, currently the adoption of interdigitated electrodes has been hindered by the relatively low mechanical response that results when using such interdigitated electrodes.

Therefore, the state of the art of piezoelectric fluid-ejection devices remains to arrange the electrodes in an opposing manner on the sheet. Arranging the electrodes on the same surface of the sheet has been largely discounted, because the electric field that can be induced within the sheet for a given voltage applied between the electrodes has been considered as too small to provide for desired fluid ejection by such devices, in terms of speed and other performance characteristics. It is believed that continued research and development in this field, for instance, has concentrated on lowering the fabrication costs of making electrical connections to electrodes in an opposing manner on the sheet, as opposed to increasing performance of fluid-ejection devices in which the electrodes are arranged on the same surface of the sheet.

The inventors have developed an approach, however, by which the electrodes can be arranged on the same surface of the sheet, while still achieving nearly the same performance as when the electrodes are arranged in an opposing manner on the sheet. In the inventive approach, rather than placing the interdigitated electrodes on the same surface of the sheet, the interdigitated electrodes are embedded within the piezoceramic sheet on the same surface of the sheet. The inventors have found that embedding the electrodes within the piezoceramic sheet on the same surface of the sheet still provides for easier electrical connections to be made as well as for higher reliability in making such electrical connections, as compared to arranging the electrodes on opposite sides of the sheet. Furthermore, embedding the electrodes within the same surface of the sheet provides for nearly the same mechanical response to be induced within the sheet, as compared to arranging the electrodes on opposite sides of the sheet.

FIG. 1 shows a cross-sectional side view of a piezoelectric fluid-ejection assembly 100 of a unimorph type, according to an embodiment of the disclosure. The assembly 100 includes a rigid orifice plate 102 having an outlet 104 through which droplets of fluid are ejected. The assembly 100 further includes a flexible diaphragm 106 having an inlet 108 to receive the fluid that is ultimately ejected as droplets through the outlet 104. The assembly 100 also includes a number of rigid sidewalls 110A and 110B, collectively referred to as the sidewalls 110, which separate the orifice plate 102 from the diaphragm 106.

A fluid chamber 112 of the assembly 100 is defined by the orifice plate 102, the diaphragm 106, and the sidewalls 110 to contain the fluid received through the inlet 108 prior to ejection of droplets of the fluid through the outlet 104. A piezoelectric actuator 114 is disposed along the diaphragm 106 opposite the fluid chamber 112. Inducing an electric field within the actuator 114 causes the actuator 114 to physically deform, which results in the diaphragm 106 and the actuator 114 to bend into the chamber 112, which in turn reduces the size of the fluid chamber 112 and thus causes droplets of the fluid to be ejected through the outlet 104. Subsequent removal of the electric field then permits the actuator 114 to relax, which returns the diaphragm 106 and actuator 114 to the unbent state.

An x-axis 116, a y-axis 118, and a z-axis 120 are depicted in FIG. 1. The x-axis 116 is parallel to the length of the piezoelectric actuator 114, from left to right in FIG. 1. The y-axis 118 is parallel to the width of the actuator 114, into the plane of FIG. 1. The z-axis 120 is parallel to the height of the actuator 114, from bottom to top in FIG. 1. In one embodiment, physical deformation of the actuator 114 responsive to inducing an electric field within the actuator 114 causes the actuator 114 to contract along the x-axis 116 and along the z-axis 120, and to expand along the y-axis 118.

In FIG. 1, the flexible diaphragm 106 includes notches 122A and 122B, collectively referred to as the notches 122, which are positioned to either side of the piezoelectric actuator 114. The notches 122 permit the diaphragm 106 to contract or expand more readily along the x-axis 116. Such increased movement of the diaphragm 106 along the x-axis reduces clamping on the actuator 114 along the x-axis 116. As depicted in FIG. 1, the notches 122 do not penetrate completely through the diaphragm 106. However, in another embodiment, the notches 122 do penetrate completely through the diaphragm 106, in which case the notches 122 may be sealed with a flexible sealant.

Figure 2:
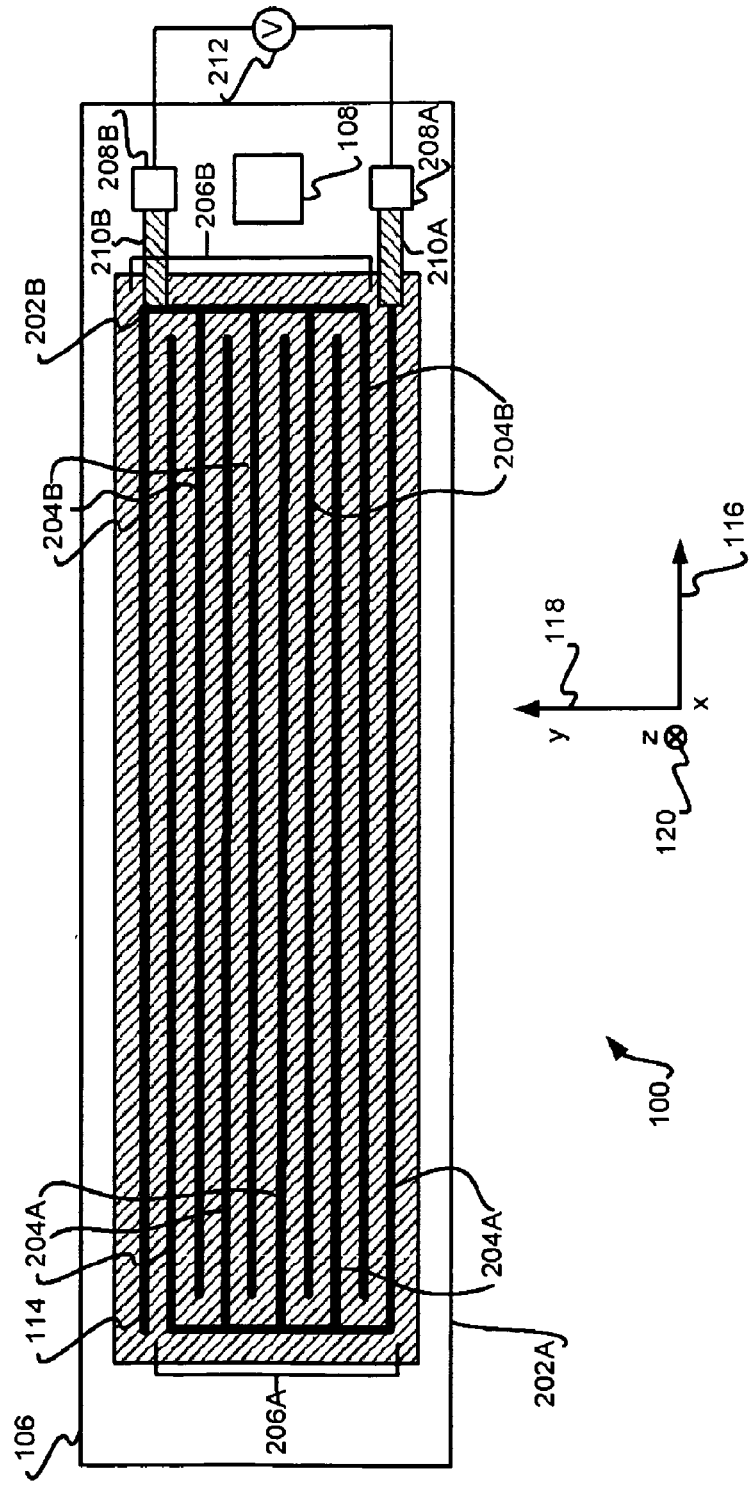
FIG. 2 is a diagram of a bottom view of a piezoelectric fluid-ejection assembly, according to an embodiment of the present disclosure.

FIG. 2 shows a bottom view of the piezoelectric fluid-ejection assembly 100, according to an embodiment of the disclosure. The flexible diaphragm 106, the inlet 108, and the piezoelectric actuator 114 are particularly depicted in FIG. 2. The actuator 114 includes interdigitated electrodes 202A and 202B, which are collectively referred to as the electrodes 202. The electrodes 202 are embedded within the actuator 114. Application of a voltage between the electrodes 202 induces an electric field within the actuator 114, which causes the actuator 114 to physically deform.

The piezoelectric actuator 114 has a length parallel to the x-axis 116 and a width parallel to the y-axis 118. The electrode 202A has a number of fingers 204A extending along the length of the actuator 114, and a bar 206A extending along the width of the actuator 114 that electrically connects the fingers 204A together. Likewise, the electrode 202B has a number of fingers 204B, as well as a bar 206B that electrically connects the fingers 204B together. The fingers 204A and 204B are collectively referred to as the fingers 204, and the bars 206A and 206B are collectively referred to as the bars 206. The bars 206 of the electrodes 202 are disposed at opposite sides of the actuator 114. The fingers 204B of the electrode 202B are interleaved in relation to the fingers 204A of the electrode 202A, and vice-versa. In this sense, the electrode 202B is said to be interdigitated in relation to the electrode 202A, and vice-versa. The fingers 202 can be equally spaced in relation to one another, to achieve identical electrical field distributions in the regions between the fingers 202, which ensures uniform deformation of the actuator 114.

Also depicted in FIG. 2 are contact pads 208A and 208B, collectively referred to as the contact pads 208, and conductive traces 210A and 210B, collectively referred to as the conductive traces 210. The conductive trace 210A electrically connects the contact pad 208A to the electrode 202A, whereas the conductive trace 210B electrically connects the contact pad 208B to the electrode 202B. A voltage source 212 is electrically connected to the contact pads 208 to provide a voltage over the electrodes 202, and thus to induce an electric field within the piezoelectric actuator 114.

Figure 3:
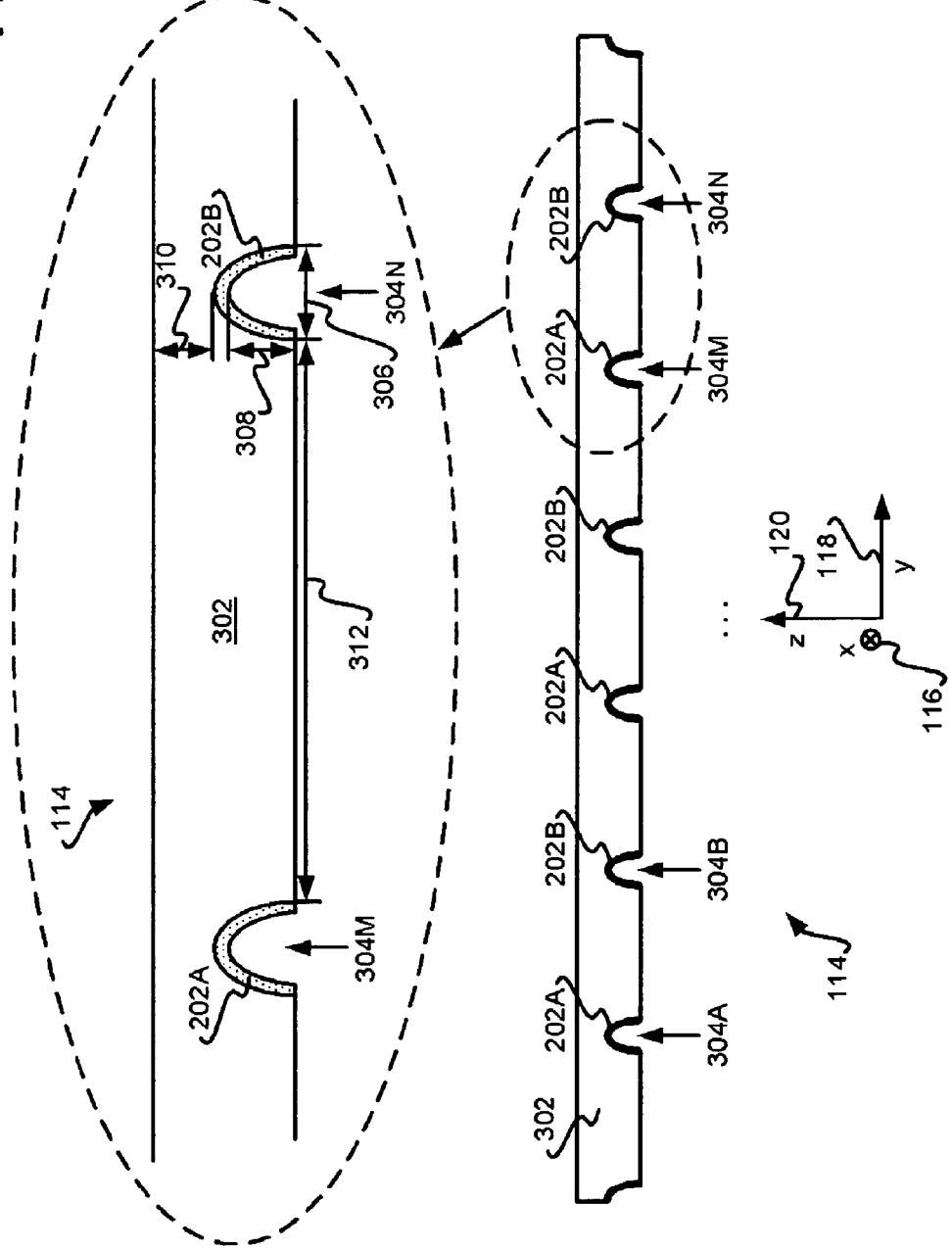
FIG. 3 is a diagram of a cross-sectional front view of an actuator of a piezoelectric fluid-ejection assembly, according to an embodiment of the present disclosure.

FIG. 3 shows a cross-sectional front view of the piezoelectric actuator 114 in detail, according to an embodiment of the disclosure. Furthermore, a portion of the actuator 114 that is encircled by a dotted line is shown in even more detail in FIG. 3. The x-axis 116 extends into the plane of FIG. 3. The y-axis 118 extends left to right in FIG. 3. The z-axis 120 extends from bottom to top in FIG. 3. The actuator 114 includes a thin film sheet 302, into the surface of which a number of grooves 304A, 304B, . . . , 304M, and 304N, collectively referred to as the grooves 304, are formed. The thin film sheet 302 is a thin film in that it has a thickness of no greater than ten microns in one embodiment, and no greater than five microns in another embodiment. The electrodes 202A and 202B are embedded within the thin film sheet 302 in that they are disposed within the grooves 304.

The grooves 304 each have an approximately parabolic profile within the thin film sheet 302 The exact shape of each groove 304 depends on the etch process employed to remove material from the piezoelectric sheet 302 to form the grooves 304. In addition, microscopic irregularities, such as ridges or pits, may appear along the surfaces of the grooves 304, due to differences in etch rates at the grain boundaries versus the grain surfaces. The inventors have found that the grooves 304 having approximately parabolic profiles is advantageous. Specifically, this profile minimizes the sizes of the locations within the thin film sheet 302 above the grooves 304 in which no electric field occurs in response to application of a voltage across the electrodes 202. A square or rectangular profile, by comparison, increases the sizes of the locations within the thin film sheet 302 above the grooves in which no electric field occurs in response to application of a voltage across the electrodes 202. Another advantage is the elimination of electric field concentrations associated with corners or sharp turns. Regions of high electric field degrade more rapidly during cyclic use relative to regions of lower electric field.

In FIG. 3, the electrodes 202 coat the surfaces of the grooves 304 without completely filling the grooves 304. Such coating promotes adhesion of the electrodes 202 to the grooves 304. However, leaving such a relatively large portion of the grooves 304 unfilled means that when the thin film sheet 302 physically deforms responsive to an electric field being induced within the sheet 302, a portion of the deformation results in expansion of the sheet 302 into the grooves 304. As such, this portion of the deformation does not contribute to the ejection of droplets of fluid from the outlet 104 in FIG. 1.

Figure 4:
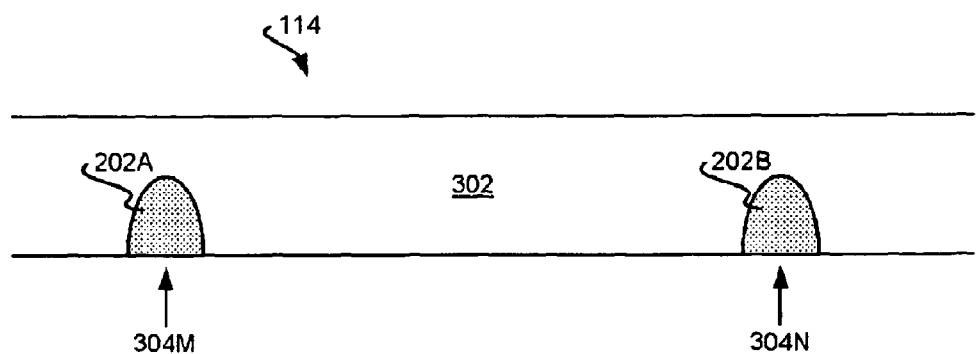
FIG. 4 is a diagram of a cross-sectional front view of a portion of an actuator of a piezoelectric fluid-ejection assembly, according to another embodiment of the present disclosure.

FIG. 4 shows a cross-sectional front view of a portion of the piezoelectric actuator 114 in detail, according to another embodiment of the disclosure. In FIG. 4, the electrodes 202 completely fill the grooves 304. As such, when the thin film sheet 302 physically deforms responsive to an electric field being induced within the sheet 302, the sheet 302 is prevented from expanding into the grooves 304. However, completely filling the grooves 304 with the electrodes 202 decreases the ability of the electrodes 202 to adhere to the grooves 304. Mechanical stress during repeated contractions of the thin film sheet 302 fatigues the interface between the electrodes 202 and the grooves 304, particularly where the thin film 302 is of a piezoelectric material.

Figure 5:
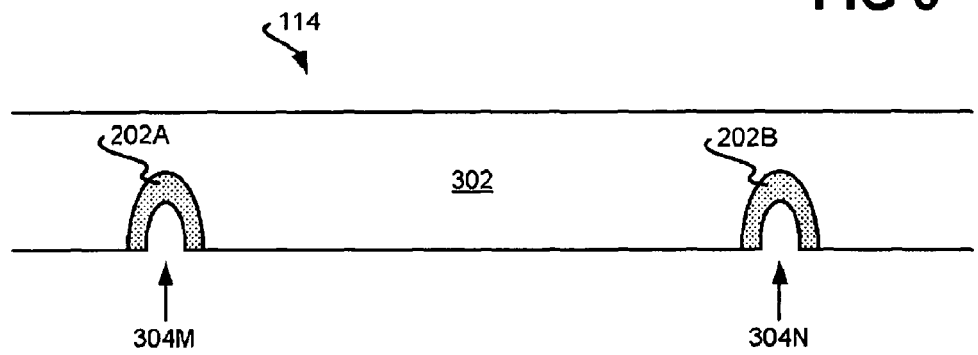
FIG. 5 is a diagram of a cross-sectional front view of a portion of an actuator of a piezoelectric fluid-ejection assembly, according to still another embodiment of the present disclosure.

FIG. 5 shows a cross-sectional front view of a portion of the piezoelectric actuator 114 in detail, according to still another embodiment of the disclosure. In FIG. 5, the electrodes 202 do not completely fill the grooves 304, but have a thickness that is greater than the thickness of the electrodes in FIG. 3. The embodiment of FIG. 5 represents a compromise between the embodiments of FIGS. 3 and 4. Similar to FIG. 3 and dissimilar to FIG. 4, the electrodes 202 in FIG. 5 adequately adhere to the surfaces of the grooves 304. Similar to FIG. 4 and dissimilar to FIG. 3, expansion of the thin film sheet 302 during physical deformation into the grooves 304 is minimized. Therefore, the thickness of the electrodes 202 in FIG. 3 is selected to minimize expansion of the thin film sheet 302 during physical deformation into the grooves 304, while still maintaining adhesion of the electrodes 202 to the surfaces of the grooves 304. Finite element analysis can be used to determine the optimal thickness of the electrodes 202 for a given electrode material with a known elastic modulus and the desired dimensions of the grooves 304.

Figure 6A:
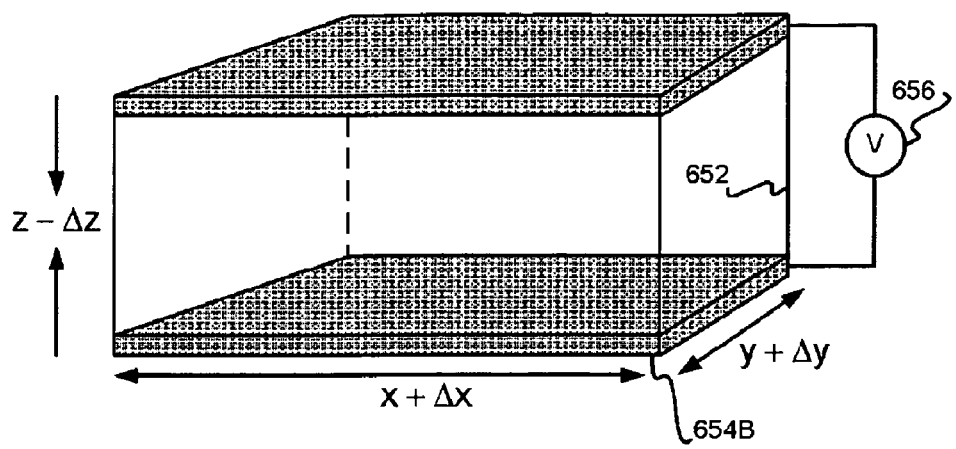
FIGS. 6A and 6B are diagrams depicting how physical deformation occurs within a piezoelectric actuator having electrodes on opposing surfaces as compared to a piezoelectric actuator having interdigitated electrodes on the same surface, according to an embodiment of the present disclosure.
Figure 6B:
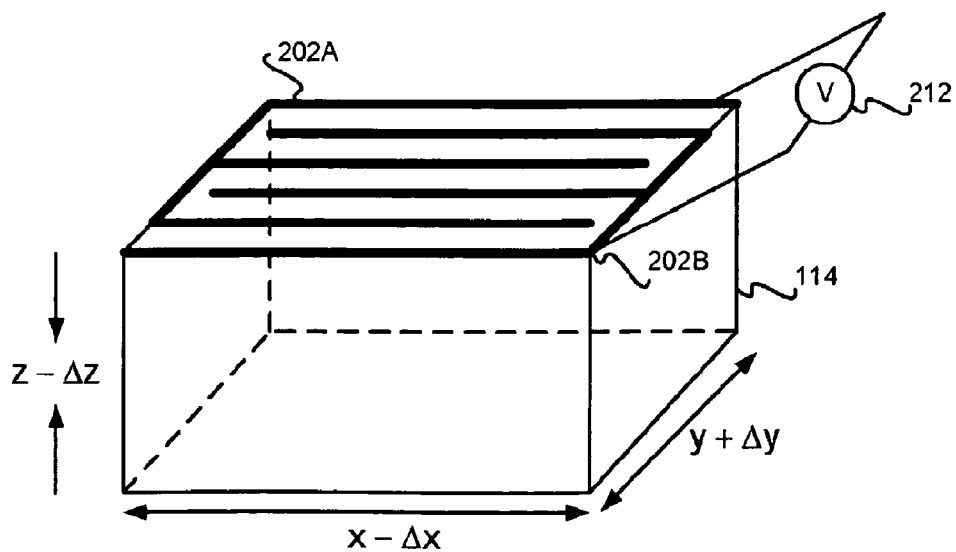

FIGS. 6A and 6B depict how a piezoelectric actuator 652 of the prior art physically deforms in what is known as a $d_{31}$ mode as compared to how the piezoelectric actuator 114 physically deforms in what is known as a $d_{33}$ mode, according to an embodiment of the disclosure. In FIG. 6A, the prior art piezoelectric actuator 652 has electrodes 654A and 654B, collectively referred to as the electrodes 654, on opposites surfaces of the actuator 652. By comparison, in FIG. 6B, the piezoelectric actuator 114 has embedded interdigitated electrodes 202 on the same surface of the actuator 652, as has been described above.

In FIG. 6A, a voltage source 656 applies a voltage between the electrodes 654. As a result, the piezoelectric actuator 652 contracts along the z-axis, but expands along the x-axis and the y-axis. Similarly, in FIG. 6B, the voltage source 212 applies a voltage between the electrodes 202. As a result, however, the piezoelectric actuator 114 contracts along both the z-axis and the x-axis, while expanding along the y-axis. Therefore, the difference between the prior art piezoelectric actuator 652 and the piezoelectric actuator 114, in terms of physical deformation, is that the actuator 652 expands along the x-axis, whereas the actuator 114 contracts along the x-axis. It is noted that the volume of the piezoelectric actuators 114 and 652 are constant to the first order during physical deformation. As such, the magnitude of the expansion in the $d_{33}$ mode of FIG. 6B is approximately twice the magnitude of the expansion in the $d_{31}$ mode of FIG. 6A.

FIG. 7 illustratively depicts a method for fabricating the piezoelectric actuator 114, according to an embodiment of the disclosure. FIG. 7 specifically depicts the fabrication of one electrode within one groove of the actuator 114, but is representative of and is described in relation to both the electrodes 202 within all the grooves 304. In part 602A, a first layer 604 of the thin film sheet 302 is formed. It is noted that in actuality, the first layer 604 may be formed as a number of individual layers, which are collectively referred to as the first layer 604 herein. Next, in part 602B, a stop layer 606 is applied to the first layer 604. The stop layer is non-reactive to a gas to which the thin film sheet 302 is reactive. Next, in part 602C, a second layer 608 is applied to the stop layer 606. As with the first layer 604, the second layer 608 may be formed as a number of individual layers, which are collectively referred to as the second layer 608 herein. The layers 604, 606, and 608 thus make up the thin film sheet 302 of the piezoelectric actuator 114.

Next, in part 602D, the second layer 608 is selectively exposed to gas or liquid to etch the grooves 304 within the second layer 608 down to, but not including, the stop layer 606, because the stop layer 606 is not reactive to the gas or liquid. That is, the second layer 608 is selectively etched to form the grooves 304. The stop layer 606 serves to control the depth to which the grooves 304 are formed. Next, in part 602E, the stop layer 606 exposed at the bottoms of the grooves 304 is etched to extend the grooves 304 up to and partially into the first layer 604. In one embodiment, the grooves 304 are extended at least half-way through the thin film sheet 302. Finally, in part 602F, conductive material is deposited within the grooves 304 (i.e., on the surfaces of the grooves 304) to form the electrodes 202 of the piezoelectric actuator 114. The penetration of the grooves 304 into the layer 604 is sufficient to expose the portions of the surfaces of the grooves 304 where most of the curvature occurs.

Figure 8:
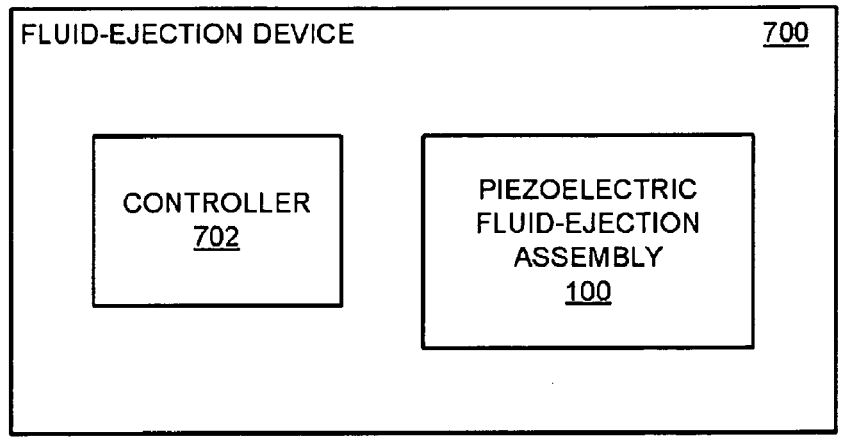
FIG. 8 is a block diagram of a representative fluid-ejection device, according to an embodiment of the present disclosure.

In conclusion, FIG. 8 shows a block diagram of a rudimentary fluid-ejection device 700, according to an embodiment of the disclosure. The fluid-ejection device 700 includes a controller 702 and the piezoelectric fluid-ejection assembly 100. The controller 702 may be implemented in software, hardware, or a combination of software and hardware, and controls ejection of droplets of fluid from the device 700 in a desired manner by the fluid-ejection assembly 100.

It is noted that the fluid-ejection device 700 may be an inkjet-printing device, which is a device, such as a printer, that ejects ink onto media, such as paper, to form images, which can include text, on the media. The fluid-ejection device 700 is more generally a fluid-ejection precision-dispensing device that precisely dispenses fluid, such as ink. The fluid-ejection device 700 may eject pigment-based ink, dye-based ink, another type of ink, or another type of fluid. Examples of other types of fluid include those having water-based or aqueous solvents, as well as those having non-water-based or non-aqueous solvents. Embodiments of the disclosure can thus pertain to any type of fluid-ejection precision-dispensing device that dispenses a substantially liquid fluid.

A fluid-ejection precision-dispensing device is therefore a drop-on-demand device in which printing, or dispensing, of the substantially liquid fluid in question is achieved by precisely printing or dispensing in accurately specified locations, with or without making a particular image on that which is being printed or dispensed on. The fluid-ejection precision-dispensing device precisely prints or dispenses a substantially liquid fluid in that the latter is not substantially or primarily composed of gases such as air. Examples of such substantially liquid fluids include inks in the case of inkjet-printing devices. Other examples of substantially liquid fluids thus include drugs, cellular products, organisms, fuel, and so on, which are not substantially or primarily composed of gases such as air and other types of gases, as can be appreciated by those of ordinary skill within the art.

It is finally noted that while embodiments of the disclosure have been substantially described in relation to a piezoelectric actuator that is part of a piezoelectric fluid-ejection assembly of a fluid-ejection device, other embodiments may not be. The piezoelectric actuator that has been described may be part of a piezoelectric fluid-ejection assembly that is not part of a fluid-ejection device. Furthermore, the piezoelectric actuator that has been described may not even be part of a piezoelectric fluid-ejection assembly or part of a fluid-ejection device. Most generally, the piezoelectric actuator may be referred to as a piezoelectric bender, which physically deforms responsive to an electric field induced therein via application of a voltage over the electrodes embedded within the actuator.

We claim:
1. A piezoelectric actuator comprising:
   a thin film sheet to physically deform in response to an electric field induced within the thin film sheet in that the thin film sheet is to contract along a z axis parallel to a height of the thin film sheet, the thin film sheet is to contract along an x axis parallel to a length of the thin film sheet, the thin film sheet is to expand along a y axis parallel to a width of the thin film sheet;
a first electrode embedded within the thin film sheet; and
a second electrode embedded within the thin film sheet, the second electrode interdigitated in relation to the first electrode,
wherein the electric field is induced within the thin film sheet via application of a voltage across the first and the second electrodes.

2. The piezoelectric actuator of claim 1, wherein the thin film sheet is a piezoceramic thin film sheet.

3. The piezoelectric actuator of claim 1, further comprising a plurality of grooves within a surface of the thin film sheet, the first and the second electrodes embedded within the thin film sheet in that the first and the second electrodes are disposed within the grooves.

4. The piezoelectric actuator of claim 3, wherein the first and the second electrodes coat surfaces of the grooves without completely filling the grooves.

5. The piezoelectric actuator of claim 4, wherein the first and the second electrodes have a predetermined thickness in coating the surfaces of the grooves.

6. The piezoelectric actuator of claim 3, wherein the first and the second electrodes completely fill the grooves.

7. The piezoelectric actuator of claim 3, wherein the grooves each have an approximately parabolic profile within the thin film sheet.

8. The piezoelectric actuator of claim 1, wherein the thin film sheet has a length and a width, the first electrode and the second electrode each have a plurality of fingers extending along the length of the thin film sheet and a bar extending along the width of the thin film sheet to electrically connect the fingers together, the bar of the first electrode disposed at an opposite side of the thin film sheet as compared to the bar of the second electrode, and the fingers of the second electrode interleaved in relation to the fingers of the first electrode.

9. A piezoelectric fluid-ejection assembly comprising:
an orifice plate having an outlet through which droplets of fluid are ejected;
a diaphragm having an inlet to receive the fluid, and comprising one or more notches;
a plurality of sidewalls separating the orifice plate from the diaphragm;
a fluid chamber defined by the orifice plate, the diaphragm, and the sidewalls to contain the fluid received through the inlet prior to ejection of the droplets of the fluid through the outlet; and,
a piezoelectric actuator disposed along the flexible diaphragm opposite the fluid chamber and comprising:
a thin film sheet to physically deform in response to an electric field induced within the thin film sheet to temporarily reduce a size of the fluid chamber to cause the droplets of fluid to be ejected through the outlet;
a first electrode embedded within the thin film sheet; and
a second electrode embedded within the thin film sheet, the second electrode interdigitated in relation to the first electrode,
wherein the electric field is induced within the thin film sheet via application of a voltage across the first and the second electrodes.

10. The piezoelectric fluid-ejection assembly of claim 9, wherein the piezoelectric actuator further comprises a plurality of grooves within a surface of the thin film sheet, the first and the second electrodes embedded within the thin film sheet in that the first and the second electrodes are disposed within the grooves.

11. A fluid-ejection device comprising:
a controller to control ejection of droplets of fluid from the fluid-ejection device in a desired manner; and,
a piezoelectric fluid-ejection assembly comprising:
an orifice plate having an outlet through which droplets of fluid are ejected;
a diaphragm having an inlet to receive the fluid;
a plurality of sidewalls separating the orifice plate from the diaphragm;
a fluid chamber defined by the orifice plate, the diaphragm, and the sidewalls to contain the fluid received through the inlet prior to ejection of the droplets of the fluid through the outlet; and,
a piezoelectric actuator disposed along the flexible diaphragm opposite the fluid chamber and comprising:
a thin film sheet to physically deform in response to an electric field induced within the thin film sheet to temporarily reduce a size of the fluid chamber to cause the droplets of fluid to be ejected through the outlet;
a first electrode embedded within the thin film sheet;
a second electrode embedded within the thin film sheet, the second electrode interdigitated in relation to the first electrode; and
a plurality of grooves within a surface of the thin film sheet the first and the second electrodes embedded within the thin film sheet in that the first and the second electrodes are disposed within the grooves,
wherein the electric field is induced within the thin film sheet via application of a voltage across the first and the second electrodes as controlled by the controller,
and wherein the first and the second electrodes coat surfaces of the grooves without completely filling the grooves.

12. The fluid-ejection device of claim 11, wherein the first and the second electrodes have a predetermined thickness in coating the surfaces of the grooves.

13. A fluid-ejection device comprising:
a controller to control ejection of droplets of fluid from the fluid-ejection device in a desired manner; and,
a piezoelectric fluid-ejection assembly comprising:
an orifice plate having an outlet through which droplets of fluid are ejected;
a diaphragm having an inlet to receive the fluid;
a plurality of sidewalls separating the orifice plate from the diaphragm;
a fluid chamber defined by the orifice plate, the diaphragm, and the sidewalls to contain the fluid received through the inlet prior to ejection of the droplets of the fluid through the outlet; and,
a piezoelectric actuator disposed along the flexible diaphragm opposite the fluid chamber and comprising:
a thin film sheet to physically deform in response to an electric field induced within the thin film sheet to temporarily reduce a size of the fluid chamber to cause the droplets of fluid to be ejected through the outlet;
a first electrode embedded within the thin film sheet;
a second electrode embedded within the thin film sheet, the second electrode interdigitated in relation to the first electrode; and
a plurality of grooves within a surface of the thin film sheet, the first and the second electrodes embedded within the thin film sheet in that the first and the second electrodes are disposed within the grooves, wherein the electric field is induced within the thin film sheet via application of a voltage across the first and the second electrodes as controlled by the controller, and wherein the grooves each have an approximately parabolic profile within the thin film sheet.

* * * * *